United States Patent
Hori et al.

(10) Patent No.: US 9,447,518 B2
(45) Date of Patent: Sep. 20, 2016

(54) RADICAL GENERATOR AND MOLECULAR BEAM EPITAXY APPARATUS

(75) Inventors: Masaru Hori, Nagoya (JP); Hiroshi Amano, Nagoya (JP); Hiroyuki Kano, Miyoshi (JP); Shoji Den, Yokohama (JP); Koji Yamakawa, Yokohama (JP)

(73) Assignees: National University Corporation Nagoya University, Nagoya-shi, Aichi (JP); NU ECO Engineering Co., Ltd., Miyoshi-shi, Aichi (JP); Katagiri Engineering Co., Ltd., Yokohama-shi, Kanagawa (JP)

( * ) Notice: Subject to any disclaimer, the term of this patent is extended or adjusted under 35 U.S.C. 154(b) by 725 days.

(21) Appl. No.: 13/819,284
(22) PCT Filed: Aug. 24, 2011
(86) PCT No.: PCT/JP2011/004684
§ 371 (c)(1),
(2), (4) Date: May 6, 2013
(87) PCT Pub. No.: WO2012/026113
PCT Pub. Date: Mar. 1, 2012

(65) Prior Publication Data
US 2013/0220223 A1  Aug. 29, 2013

(30) Foreign Application Priority Data

Aug. 27, 2010 (JP) ................................. 2010-190697
Aug. 27, 2010 (JP) ................................. 2010-190966

(51) Int. Cl.
*C23C 16/00* (2006.01)
*H01L 21/326* (2006.01)
(Continued)

(52) U.S. Cl.
CPC ............. *C30B 23/02* (2013.01); *C30B 23/066* (2013.01); *H01J 37/321* (2013.01); *H05H 1/30* (2013.01); *H05H 1/46* (2013.01); *H05H 2001/2462* (2013.01); *H05H 2001/2468* (2013.01)

(58) Field of Classification Search
CPC .................... H01J 37/32082; H01J 37/32091; H01J 37/321; H01J 37/3211; H01J 37/32119; H01J 37/32357; H01J 37/3244; H01J 37/32458; H01J 37/32467; H01J 37/32477; H01J 37/32486; H01J 37/32495; H01J 37/32504

USPC .............. 118/723 I, 723 IR, 723 AN, 723 E, 118/723 ER; 156/345.48, 345.49, 345.47; 315/111.51
See application file for complete search history.

(56) References Cited

U.S. PATENT DOCUMENTS

2005/0258766 A1\* 11/2005 Kim ..................... H01J 37/321
315/111.21
2006/0137610 A1\* 6/2006 Yoshizaki ............. C23C 16/325
118/723 E

FOREIGN PATENT DOCUMENTS

JP      2-218433 A     8/1990
JP   2005-307332 A   11/2005
(Continued)

OTHER PUBLICATIONS

European Search Report dated Jul. 15, 2014.
(Continued)

*Primary Examiner* — Luz Alejandro Mulero
(74) *Attorney, Agent, or Firm* — McGinn IP Law Group, PLLC

(57) ABSTRACT

A radical generator includes a supply tube, a plasma-generating tube, a coil winding about an outer circumference of the plasma-generating tube, for generating an inductively coupled plasma in the plasma-generating tube, an electrode for generating a capacitively coupled plasma in the plasma-generating tube and adding the capacitively coupled plasma to the inductively coupled plasma, and a parasitic-plasma-preventing tube including a dielectric material which extends from a bottom of the plasma-generating tube to an opening of the supply tube in a space between the bottom and the opening, and a tip part thereof is inserted into the supply tube to cover an inner wall of the supply tube for preventing a generation of a parasitic plasma between the electrode and the inner wall of the supply tube.

10 Claims, 5 Drawing Sheets

(51) Int. Cl.
*C30B 23/02* (2006.01)
*H05H 1/46* (2006.01)
*H01J 37/32* (2006.01)
*C30B 23/06* (2006.01)
*H05H 1/30* (2006.01)
*H05H 1/24* (2006.01)

(56) References Cited

FOREIGN PATENT DOCUMENTS

| | | |
|---|---|---|
| JP | 2008-78200 A | 4/2008 |
| JP | 2009-4157 A | 1/2009 |
| JP | 2009-004157 A | 1/2009 |
| JP | 2009-224269 A | 10/2009 |
| JP | 2009-272318 A | 11/2009 |

OTHER PUBLICATIONS

Japanese Office Action in Application No. 2010-190967 dated Jun. 10, 2014 with a partial English translation.
Japanese Office Action in Application No. 2010-190966 dated Sep. 9, 2014 with a partial English translation.
International Search Report (ISR) (PCT Form PCT/ISA/210) dated Nov. 22, 2011, in PCT/JP2011/004684.

* cited by examiner

RADICAL GENERATOR AND MOLECULAR BEAM EPITAXY APPARATUS

TECHNICAL FIELD

The present invention relates to a radical generator for generating high-density radicals and, more particularly, to a radical generator for generating radicals by the mediation of an ICP plasma in combination with a CCP plasma. The present invention also relates to a molecular beam epitaxy (MBE) apparatus having the radical generator of the invention and a molecular beam cell and, more particularly, to an MBE apparatus which can provide high-density radicals from the radical generator and which attains an improved film formation rate.

BACKGROUND ART

In recent years, Group III nitride semiconductor materials have come to play a more important role in production of LEDs and power devices. Group III nitride semiconductor crystals are known to be produced through metal-organic chemical vapor deposition (MOCVD) or molecular beam expiaxy (MBE), and currently, MOCVD is preferably employed.

However, the MOCVD technique has drawbacks such as high production cost due to use of a large amount of ammonia, and absence of effective organometallic materials containing rare earth metal elements which are to be added to a Group III nitride semiconductor for producing multi-color-light-emitting LEDs.

A Group III nitride semiconductor crystal is known to be also formed through a technique such as molecular beam epitaxy (MBE). The MBE technique has advantages in that a low-impurity-concentration Group III nitride semiconductor can be easily formed, and that a rare earth metal element can be easily added to the semiconductor material.

In the case where a Group III nitride semiconductor crystal is formed through MBE, a Group III element and nitrogen atom vapor are required as raw materials. The Group III element, which assumes the form of solid metal, is generally placed in a crucible made of PBN (pyrolytic boron nitride) and heated in the crucible, to thereby generate atomic vapor. In contrast, nitrogen assumes the form of gas under ambient conditions, vapor of nitrogen atoms is generally generated by, for example, decomposing molecular nitrogen gas or ammonia. In one procedure of forming atomic nitrogen vapor through decomposition of molecular nitrogen gas, a nitrogen radical generator which employs an inductively coupled plasma generated by applying high-frequency power to a coil-form electrode is employed (see, for example, Patent Document 2). In order to enhance the growth rate of a Group III nitride semiconductor by means of a nitrogen radical generator, the nitrogen radical flux density must be enhanced.

Patent Document 1 discloses a radical generator which can generate high-density radicals. The radical generator disclosed in Patent Document 1 has a nitrogen gas supply tube, a CCP unit for generating CCP (capacitively coupled plasma), and an ICP unit for generating ICP (inductively coupled plasma), which are sequentially connected in series. In the plasma generator, a nitrogen gas plasma is formed in the CCP unit before plasma generation in the ICP unit, whereby a high nitrogen radical density can be attained.

PRIOR ART DOCUMENTS

Patent Documents

Patent Document 1: Japanese Patent Application Laid-Open (kokai) No. 2009-4157
Patent Document 2: Japanese Patent Application Laid-Open (kokai) No. 2008-78200

SUMMARY OF THE INVENTION

Problems to be Solved by the Invention

For further enhancing the Group III nitride semiconductor crystal growth rate, the radical density attained by the radical generator disclosed in Patent Document 1 must be further enhanced. Thus, there is demand for a radical generator which attains higher radical density.

In addition, conventional MBE apparatuses have a problem in that the nitrogen radical density attained by a radical generator is insufficient, resulting in poor film formation rate of a target Group III nitride semiconductor. One possible approach for improving the film formation rate is adoption of the radical generator disclosed in Patent Document 1 which attains improved nitrogen radical density to an MBE apparatus. However, even when the radical generator disclosed in Patent Document 1 is employed, the nitrogen radical density is still unsatisfactory for enhancing the film formation rate of a target Group III nitride semiconductor.

In view of the foregoing, an object of the present invention is to provide a radical generator which can produce radicals at higher density.

Another object of the invention is to provide an MBE apparatus including the radical generator, which MBE apparatus realizes a high radical density attained by the radical generator and which provides an improved crystal film formation rate.

Means for Solving the Problems

In a first aspect of the present invention, there is provided a radical generator characterized by comprising:
a supply tube for supplying a gas, the tube being made of a conductive material;
a plasma-generating tube made of a dielectric material, the plasma-generating tube being connected to the supply tube at the downstream end thereof;
a coil winding about the outer circumference of the plasma-generating tube, for generating an inductively coupled plasma in the plasma-generating tube;
an electrode which covers the outer wall of the plasma-generating tube and which is disposed more proximal to the supply tube than the coil is, for generating a capacitively coupled plasma in the plasma-generating tube and adding the capacitively coupled plasma to the inductively coupled plasma; and
a parasitic-plasma-preventing tube which is made of a dielectric material, which is connected to the opening of the supply tube proximal to the connection site between the supply tube and the plasma-generating tube, and which covers the inner wall of the supply tube.

By virtue of the supply tube, a gas of interest can be supplied to the plasma-generating tube. Examples of the gas include nitrogen, oxygen, hydrogen, ammonia, water, a fluorocarbon, a hydrocarbon, silane, and germane. Radicals of interest can be produced from the gases. Among these gases, nitrogen, oxygen, hydrogen, and ammonia are particularly useful for generating radicals. These gases may be diluted with a rare gas such as argon.

The parasitic-plasma-preventing tube is disposed so as to prevent a drop in radical density, which would otherwise be caused by generation of a parasitic plasma between the electrode and the inner wall of the supply tube. The parasitic-plasma-preventing tube may be made of a ceramic material such as BN, PBN, $Al_2O_3$, or $SiO_2$.

The inner diameter of the zone of the plasma-generating tube where a capacitively coupled plasma is generated and that of the zone of the plasma-generating tube where an inductively coupled plasma is generated may be identical to or different from each other.

The second aspect of the present invention is directed to a specific embodiment of the radical generator according to the first aspect, which further comprises a plurality of permanent magnets which are disposed along the outer circumference of the zone of the plasma-generating tube where a capacitively coupled plasma is generated and which localize the capacitively coupled plasma to the center of the plasma-generating tube.

The permanent magnets preferably have a high Curie temperature for preventing degaussing and are made of, for example, an Sm—Co magnet or an Al—Ni—Co magnet.

The third aspect of the present invention is directed to a specific embodiment of the radical generator according to the second aspect, wherein the electrode has an inner space in which water can be refluxed, and the permanent magnets are disposed so as to be exposed to the inner space of the electrode.

The fourth aspect of the present invention is directed to a specific embodiment of the radical generator according to the first to third aspects, wherein the gas supplied through the supply tube is nitrogen, and nitrogen radicals are generated.

In a fifth aspect of the present invention, there is provided a molecular beam epitaxy apparatus comprising a radical generator for generating a radical species, a molecular beam cell for generating a molecular beam or an atomic beam, and a vacuum chamber for accommodating a substrate therein, in use, the substrate being irradiated with the radical species and the molecular beam or the atomic beam in vacuum, to thereby form, on the substrate, a crystal of a compound derived from the element of the radical species and the element of the molecular beam or the atomic beam, characterized in that the radical generator comprises:

a supply tube for supplying a gas, the tube being made of a conductive material;

a plasma-generating tube made of a dielectric material, the plasma-generating tube being connected to the supply tube at the downstream end thereof;

a coil winding about the outer circumference of the plasma-generating tube, for generating an inductively coupled plasma in the plasma-generating tube;

an electrode which covers the outer wall of the plasma-generating tube and which is disposed more proximal to the supply tube than the coil is, for generating a capacitively coupled plasma in the plasma-generating tube and adding the capacitively coupled plasma to the inductively coupled plasma; and a parasitic-plasma-preventing tube which is made of a dielectric material, which is connected to the opening of the supply tube proximal to the connection site between the supply tube and the plasma-generating tube, and which covers the inner wall of the supply tube.

In the above case, a plurality of radical generators may be provided, along with an additional radical generator for supplying radicals of an element other than the elements forming the crystal of the compound to be grown. In one possible configuration, there are provided a radical generator for supplying nitrogen radicals serving as a material for forming a Group III nitride semiconductor film, and an additional radical generator for supplying hydrogen radicals serving as, for example, a material for cleaning the substrate.

The same descriptions about the radical generator given in relation to the first to fourth aspects are also applied to the molecular beam epitaxy apparatus of the fifth aspect.

The sixth aspect of the present invention is directed to a specific embodiment of the molecular beam epitaxy apparatus of the fifth mode, wherein the radical generator further includes a plurality of permanent magnets which are disposed along the outer circumference of the zone of the plasma-generating tube where a capacitively coupled plasma is generated and which localize the capacitively coupled plasma to the center of the plasma-generating tube.

The permanent magnets preferably have a high Curie temperature for preventing degaussing and are made of, for example, an Sm—Co magnet or an Al—Ni—Co magnet.

The seventh aspect of the present invention is directed to a specific embodiment of the molecular beam epitaxy apparatus of the sixth mode, wherein the electrode of the radical generator has an inner space in which water can be refluxed, and the permanent magnets are disposed so as to be exposed to the inner space of the electrode.

The eighth aspect of the present invention is directed to a specific embodiment of the molecular beam epitaxy apparatus of the fifth to seventh modes, wherein the radical generator is a nitrogen radical generator in which nitrogen is supplied through the supply tube, to thereby generate nitrogen radicals, and a crystal of a nitride compound is grown.

The ninth aspect of the present invention is directed to a specific embodiment of the molecular beam epitaxy apparatus of the eighth mode, wherein the molecular beam cell generates a molecular beam of a Group III metal, and a crystal of a Group III nitride semiconductor compound is grown.

Effects of the Invention

According to the first aspect of the invention, a parasitic-plasma-preventing tube is provided. Therefore, generation of a parasitic plasma in the supply tube, which would otherwise be caused by electric discharge between the inner wall of the supply tube and the capacitively coupled plasma electrode, can be prevented. As a result, a capacitively coupled plasma is generated solely in the plasma-generating tube, whereby the plasma density increases. In this case, radical formation performance on the basis of a capacitively coupled plasma can be enhanced, to thereby realize a radical generator which can provide higher-density radicals.

According to the second aspect of the invention, a capacitively coupled plasma can be added to an inductively coupled plasma, while the capacitively coupled plasma is localized at high density in the center of the plasma-generating tube. In the case where the gas pressure is elevated for increasing the radical flux density, a decrease in inductively coupled plasma density at the center of the plasma-generating tube can be compensated. Thus, higher-density radicals can be generated. Meanwhile, there are many electrons having high energy in the capacitively coupled plasma. When such electrons are injected to the inductively coupled plasma, decomposition of gas molecules to the corresponding gas atoms can be promoted, and atomic radicals can gain high internal energy.

According to the third aspect of the invention, water is refluxed in the inner space of the capacitively coupled plasma electrode. Thus, rise in temperature of the capacitively coupled plasma electrode can be suppressed. Also, since the magnets can be cooled through direct immersion in water, degaussing of the magnets can be suppressed, whereby generation of high-density radicals can be maintained for a long period of time.

According to the fourth aspect of the invention, the radical generator of the present invention can generate nitrogen radicals at high density. In addition, since decomposition of nitrogen molecules to nitrogen atoms can be performed at high efficiency, the internal energy of nitrogen atoms can be elevated. Such nitrogen atom radicals having high internal energy are very useful in crystal growth of a nitride compound such as a Group III nitride semiconductor, since the radicals can lower the growth temperature.

According to fifth aspect of the invention, the radical generator of the molecular beam epitaxy apparatus is provided with a parasitic-plasma-preventing tube. Therefore, generation of a parasitic plasma in the supply tube, which would otherwise be caused by electric discharge between the inner wall of the supply tube and the capacitively coupled plasma electrode, can be prevented. As a result, a capacitively coupled plasma is generated solely in the plasma-generating tube, whereby the plasma density increases. In this case, radical formation performance on the basis of a capacitively coupled plasma can be enhanced, to thereby realize a radical generator which can provide higher-density radicals. Thus, the molecular beam epitaxy apparatus according to the fifth aspect of the invention can supply high-density radicals by the mediation of the radical generator, whereby film formation rate can be improved.

According to the radical generator of the molecular beam epitaxy apparatus according to the sixth aspect of the invention, a capacitively coupled plasma can be added to an inductively coupled plasma, while the capacitively coupled plasma is localized at high density in the center of the plasma-generating tube. In the case where the gas pressure is elevated for increasing the radical flux density, a decrease in inductively coupled plasma density at the center of the plasma-generating tube can be compensated. Thus, higher-density radicals can be generated. Meanwhile, there are many electrons having high energy in the capacitively coupled plasma. When such electrons are injected to the inductively coupled plasma, decomposition of gas molecules to the corresponding gas atoms can be promoted, and atomic radicals can gain high internal energy. Such atomic radicals having high internal energy can enhance surface migration performance at the crystal surface. In other words, radicals of an element which have reached the substrate surface sufficiently move and readily reach growth sites. In this case, the crystallinity of the grown crystal can be enhanced. Thus, the molecular beam epitaxy apparatus according to the sixth aspect can provide high-density and high-internal-energy atomic radicals by the mediation of the radical generator, whereby the crystallinity of the grown crystal can be enhanced. In addition, the growth temperature at film formation can be lowered.

In the plasma source of the molecular beam epitaxy apparatus according to the seventh aspect, water is refluxed in the inner space of the capacitively coupled plasma electrode. Thus, rise in temperature of the capacitively coupled plasma electrode can be suppressed. Also, since the magnets can be cooled through direct immersion in water, degaussing of the magnets can be suppressed, whereby generation of high-density radicals can be maintained for a long period of time. Thus, according to the seventh aspect of the invention, film formation can be reliably performed.

According to the eighth aspect of the invention, the molecular beam epitaxy apparatus of the present invention can be employed in nitride film formation. According to the ninth aspect of the invention, the molecular beam epitaxy apparatus of the present invention can be employed in Group III nitride semiconductor film formation.

MODES FOR CARRYING OUT THE INVENTION

Specific embodiments of the present invention will next be described in detail with reference to the drawings. However, these embodiments should not be construed as limiting the present invention thereto.

Embodiment 1

Figure 1:
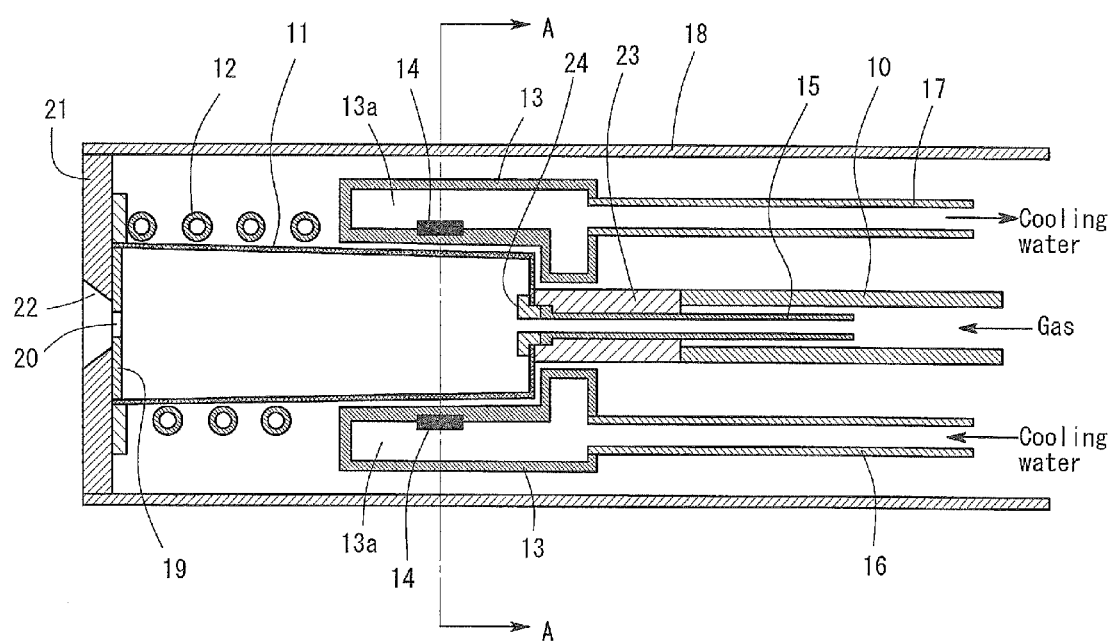
FIG. 1A schematic view of the configuration of the radical generator of Embodiment 1.
Figure 2:
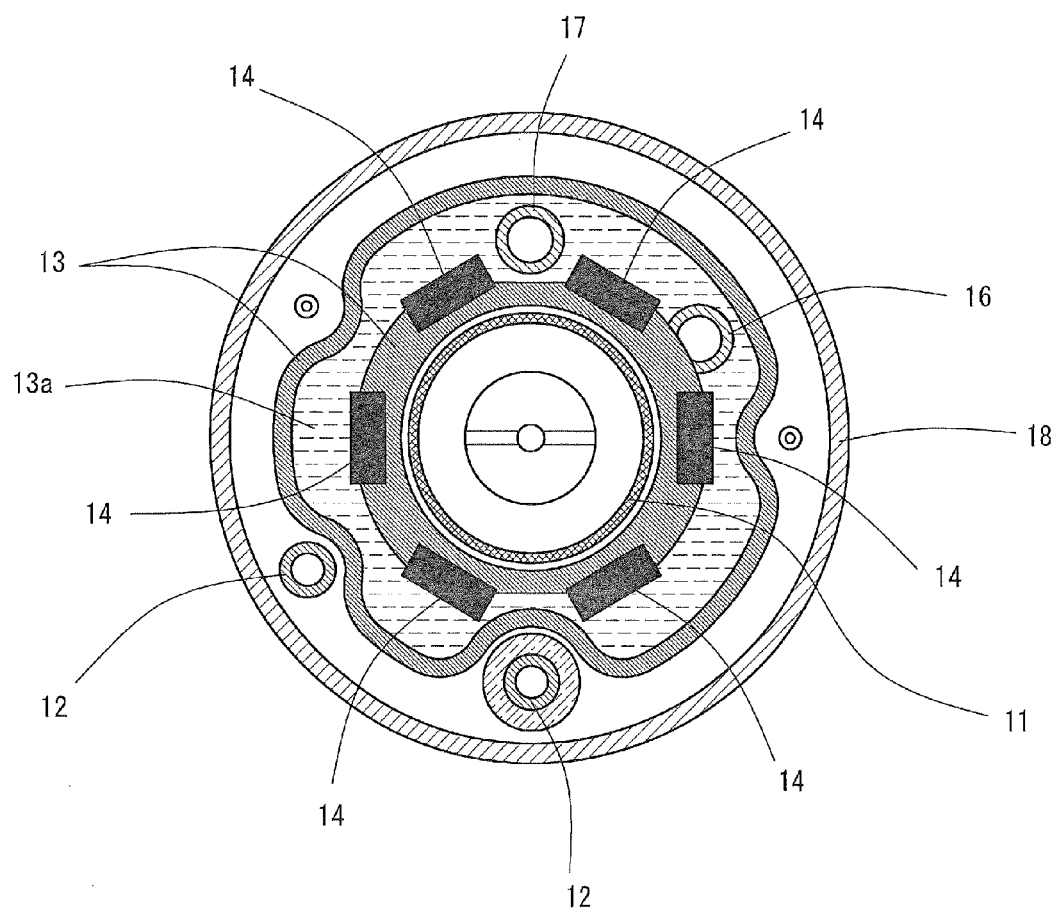
FIG. 2 A cross-section of the radical generator of Embodiment 1, cut along A-A shown in FIG. 1.

FIG. 1 is a schematic view of the configuration of the radical generator of Embodiment 1. FIG. 2 is a cross-section of the radical generator of Embodiment 1, cut along A-A shown in FIG. 1.

As shown in FIGS. 1 and 2, the radical generator of Embodiment 1 has a metallic casing 18, a metallic end plate 21 disposed at an end of the casing 18, a cylindrical supply tube 10 made of SUS, and a cylindrical plasma-generating tube 11 which is connected to the supply tube 10 and which is made of insulating pyrolytic boron nitride (PBN). At the center of the end plate 21 there is provided with an opening 22 through which the generated plasma is output. The plasma-generating tube 11 has an inner diameter of 24 mm and a length in the axial direction of 90 mm. An orifice plate 19 is disposed at the opening of the plasma-generating tube 11 which opening is disposed opposite the supply tube 10. The orifice plate 19 has a pore 20 with a diameter of 5 mm at the center of the opening of the plasma-generating tube 11. The pore 20 is co-axially provided with the opening 22 of the end plate 21.

A double-pipe cylindrical CCP electrode 13 is disposed in the vicinity of the connection portion between the supply tube 10 and the plasma-generating tube 11 and outside the plasma-generating tube 11. The CCP electrode 13 has an inner space 13a defined by the double-pipe cylinder. To the CCP electrode 13, a water-supplying tube 16 and a water-discharging tube 17 are connected. Thus, the inner space 13a of the CCP electrode 13 is communicated with the water-supplying tube 16 and the water-discharging tube 17. Through this configuration, cooling water can be supplied via the water-supplying tube 16 to the inner space 13a of the CCP electrode 13, and the water can be discharged through water-discharging tube 17, whereby the CCP electrode 13 can be cooled through refluxing cooling water.

The inner wall of the CCP electrode 13 (i.e., the inner space 13a) is provided with six permanent magnets 14 which are disposed along the outer circumference of the zone of the plasma-generating tube 11 at the equal intervals. The permanent magnets 14 are made of SmCo. Each permanent magnet 14 has been magnetized in the direction orthogonal to the cylinder center axis (i.e., magnet thickness direction), and the plane proximal to the plasma-generating tube 11 has been magnetized as an N pole or an S pole. The two permanent magnets 14 adjacent each other have inner planes (planes proximal to the plasma-generating tube 11) of different magnetic poles. That is, the inner planes of the permanent magnets 14 are magnetized such that an N pole and an S pole are alternatingly repeated along the circumferential direction. These permanent magnets 14 are exposed to the inner space 13a of the CCP electrode 13. Thus, when cooling water is refluxed through the inner space 13a of the CCP electrode 13 so as to cool the CCP electrode 13, the cooling water comes into direct contact with the permanent magnets 14. In this case, rise in temperature of the permanent magnets 14, which would otherwise be caused by heating of the CCP electrode 13, can be effectively suppressed.

A coil 12 is disposed so that the coil winds about the outer circumference of the plasma-generating tube 11. The coil 12 is located outside the plasma-generating tube 11 and at the downstream end of the CCP electrode 13 (i.e., opposite the supply tube 10 side). The coil 12 is formed of a hollow stainless steel tube which has been wound 3.5 times. The coil 12 can be cooled through passage of cooling water in the inner space of the stainless steel tube.

To the CCP electrode 13 and the coil 12, a high-frequency power source (not illustrated) is connected. The supply tube 10, the casing 18, and the end plate 21 remain at the same voltage and are grounded. One end of the coil 12 is grounded. By means of the high-frequency power source, high-frequency electric power is applied between the CCP electrode 13 and the ground. Also, high-frequency electric power is applied between the other end of the coil 12 and the ground by means of the high-frequency power source. Through this configuration, an inductively coupled plasma can be generated in the zone inside the plasma-generating tube 11 where the coil 12 is disposed at the outer circumference of the tube, and a capacitively coupled plasma can be generated in the zone inside the plasma-generating tube 11 where the CCP electrode 13 is disposed at the outer circumference of the tube.

Into the opening of the supply tube 10 disposed at the connection portion between the supply tube 10 and the plasma-generating tube 11, a parasitic-plasma-preventing tube 15 made of an insulating ceramic material is inserted toward the supply tube 10. The parasitic-plasma-preventing tube 15 is built in a holder 23, which covers the tube 15 and extends to the supply tube 10. The holder 23 and the supply tube 10 connecting to the holder 23 are connected to the plasma-generating tube 11 such that the end face of plasma-generating tube 11 is sandwiched by the end face of the holder 23 and the stopper 24. Each of the parasitic-plasma-preventing tube 15, the holder 23, and the stopper 24 is made of an insulating ceramic material of boron nitride. The parasitic-plasma-preventing tube 15 has an inner diameter of 1 mm and an outer diameter which is almost equivalent to the inner diameter of the supply tube 10. Through insertion of the parasitic-plasma-preventing tube 15 into the supply tube 10, the inner wall of the supply tube 10 is covered with the parasitic-plasma-preventing tube 15, whereby generation of a parasitic plasma between the CCP electrode 13 and the inner wall of the supply tube 10 is prevented.

In order to effectively prevent generation of a parasitic plasma, the insertion length of the parasitic-plasma-preventing tube 15 is preferably 10 times or more the inner diameter of the supply tube 10, more preferably 20 to 50 times the inner diameter of the supply tube 10.

The plasma-generating tube 11, the coil 12, and the CCP electrode 13 are built in the cylindrical casing 18. The radical-radiating end of the casing 18 is connected to the end plate 21 having the opening 22 at the center thereof. An additional electrode for removing ions (not illustrated) or an additional magnet (not illustrated) may be disposed in the vicinity of the opening 22.

In use of the radical generator of Embodiment 1, a gas is supplied to the plasma-generating tube 11 through the supply tube 10. Then, high-frequency electric power is applied to the coil 12 and the CCP electrode 13, to thereby generate an inductively coupled plasma and a capacitively coupled plasma in the plasma-generating tube 11. High-density radicals are generated through injection of the capacitively coupled plasma to the inductively coupled plasma.

In the radical generator of Embodiment 1, the parasitic-plasma-preventing tube 15 is inserted into the supply tube 10, to thereby prevent generation of a parasitic plasma in the supply tube 10, which would otherwise be caused by electric discharge between the CCP electrode 13 and the inner wall of the supply tube 10. Through insertion of the parasitic-plasma-preventing tube 15, the capacitively coupled plasma is generated only in the plasma-generating tube 11, and the plasma density of the capacitively coupled plasma is enhanced. Thus, the density of the generated radicals is also enhanced.

The capacitively coupled plasma is localized at high density in the center of the plasma-generating tube 11 by the mediation of a cusp field provided by the six permanent magnets 14. Specifically, a magnetic flux is formed from the N-polar inner plate of one permanent magnet 14 to the S-polar inner plane of one permanent magnet 14 adjacent thereto, whereby arc-shape magnetic flux units are formed at intervals of 60 degrees. The plasma is expelled from the magnetic flux units, whereby the capacitively coupled plasma is localized at high density in the center of the plasma-generating tube 11. In the case where high gas pressure is employed in order to enhance molecule decomposition performance, the inductively coupled plasma is generally in the low-bright mode, rather than in the high-bright mode. The "high-bright mode" is a state in which a plasma is generated in the center of the plasma-generating tube 11, with the radical density being higher in the vicinity of the center. In contrast, the "low-bright mode" is a state in which a plasma is generated along the inner wall of the plasma-generating tube 11, with the plasma density being lower in the vicinity of the center. In this case, the entire radical density is low, and the output radicals have a low density. However, through adding a capacitively coupled plasma localized to the center to the inductively coupled plasma, the low-bright-mode plasma is modified, to thereby compensate lowering in plasma density at the center. As a result, even when high gas pressure is employed, the plasma density at the center is enhanced, and considerably high radical density can be attained, as compared with the case in which only an inductively coupled plasma is generated. In addition, by virtue of a large number of high-energy electrons present in the capacitively coupled plasma, gas molecules are effectively decomposed to the corresponding gas atoms, and the thus-generated atomic radicals come to have an enhanced internal energy. When such atomic radicals having high internal energy are employed in, for example, a source element of crystal growth, growth temperature can be lowered, which is very advantageous.

In addition, the permanent magnets 14 can be directly cooled by refluxing cooling water through the inner space 13a of the CCP electrode 13, whereby rise in temperature of the permanent magnets 14 is suppressed, to thereby effectively prevent degaussing of the permanent magnets 14. As a result, the CCP plasma localized to the center of the plasma-generating tube 11 can be maintained for a long period of time, and high-density radical generation can be maintained for a long period of time.

The radical generator of Embodiment 1 can generate any radical species through supply of a gas of interest via the supply tube 10. Examples of the gas to be supplied include nitrogen, oxygen, hydrogen, ammonia, water, fluorocarbon, hydrocarbon, silane, and germane. Any radical species of interest may be obtained from these gases. Among these gases, nitrogen, oxygen, hydrogen, and ammonia are used for generating useful radicals. When a gas is supplied through the supply tube 10, the gas may be diluted with a rare gas such as argon.

Figure 3:
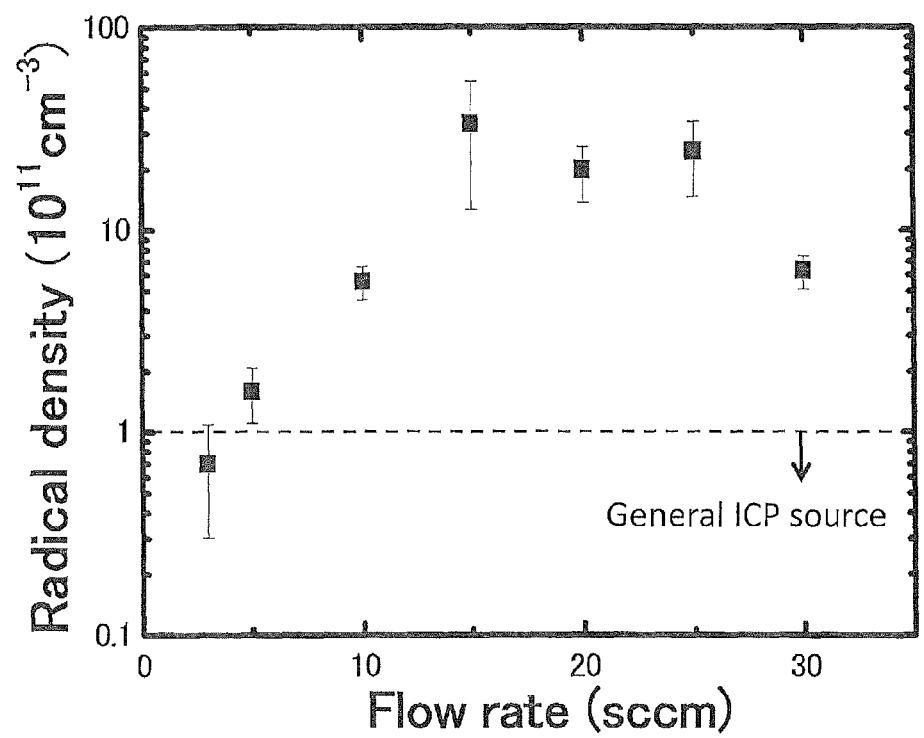
FIG. 3 A graph showing the relationship between the gas flow rate in the radical generator of Embodiment 1 and the nitrogen radical density.

FIG. 3 is a graph showing the relationship between the density of the nitrogen radicals which have been generated by means of the radical generator of Embodiment 1 and the flow rate of the nitrogen gas. The nitrogen radical density was measured through vacuum ultraviolet spectrometry. As shown in the graph, the nitrogen radical density of the product obtained by means of a conventional radical generator employing an inductively coupled plasma is about $1 \times 10^{11}$ cm$^{-3}$ or lower. However, when the radical generator of Embodiment 1 is employed, a radical density higher than $1 \times 10^{11}$ cm$^3$ can be attained at a nitrogen gas flow rate of 5 to 35 sccm. Particularly when the nitrogen gas flow rate 15 to 25 sccm, the nitrogen radical density is $1 \times 10^{12}$ cm$^{-3}$ or higher, which is 10 times or higher (about 20 to 30 times) the nitrogen radical density attained by a conventional radical generator.

Embodiment 2

Figure 4:
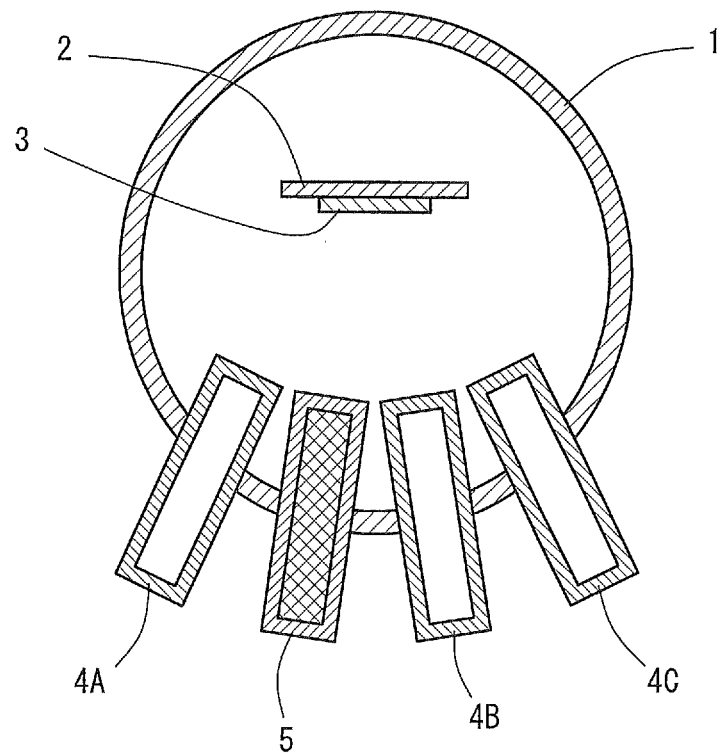
FIG. 4 A schematic view of the configuration of the MBE apparatus of Embodiment 2.

An MBE apparatus according to Embodiment 2 will next be described. FIG. 4 is a schematic view of the configuration of the MBE apparatus of Embodiment 2. As shown in FIG. 4, the MBE apparatus of Embodiment 2 includes a vacuum chamber 1 whose inside can be maintained at about $10^{-8}$ Pa (i.e., ultra-vacuum), a substrate stage 2 disposed in the vacuum chamber 1 which stage can hold a substrate 3 and can rotate and heat the substrate 3, molecular beam cells 4A, 4B, and 4C which can radiate a molecular beam (atomic beam) onto the surface of the substrate 3, and a radical generator 5 for supplying nitrogen radicals onto the surface of the substrate 3.

In use of the MBE apparatus of Embodiment 2, the surface of the substrate 3 which has been heated and maintained in ultra-vacuum is irradiated with Group III metal atomic beams supplied by molecular beam cells 4A, 4B, and 4C, and with nitrogen radicals supplied by the radical generator 5, whereby a Group III nitride semiconductor crystal is formed on the surface of the substrate 3.

Each of the molecular beam cells 4A, 4B, and 4C has a crucible for holding a Group III metal material, a heater for heating the crucible, and a shutter. The crucible is heated to thereby generate a Group III metal vapor, and an atomic beam of the metal element is formed. The dose of the atomic beam is regulated through opening/shutting the shutter. In one embodiment, the molecular beam cell 4A contains Ga, the molecular beam cell 4B contains In, and the molecular beam cell 4C contains Al, and atomic beams of respective elements are generated. An additional molecular cell 4 holding an n-type impurity (e.g., Si) or a p-type impurity (e.g., Mg) may be provided, and the substrate 3 may be irradiated with the molecular beam provided by the molecular beam cell 4.

The radical generator 5 has the same structure as that of the radical generator of Embodiment 1 (see FIGS. 1 and 2). In Embodiment 2, nitrogen gas is supplied through the supply tube 10 to the plasma-generating tube 11, where nitrogen gas is decomposed. As described in Embodiment 1, the capacitively coupled plasma is localized at high density in the center of the plasma-generating tube 11 by the mediation of a cusp field provided by the six permanent magnets 14. In the case where high gas pressure is employed in order to enhance nitrogen molecule decomposition performance, the inductively coupled plasma is in the low-bright mode, and the radical density is low in the center of the plasma-generating tube 11. However, through adding a capacitively coupled plasma localized to the center of the inductively coupled plasma, the low-bright-mode plasma is modified, to thereby compensate lowering in plasma density at the center. As a result, even when high gas pressure is employed, the plasma density at the center is enhanced, and considerably high radical density can be attained, as compared with the case in which only an inductively coupled plasma is generated. In addition, by virtue of a large number of high-energy electrons present in the capacitively coupled plasma, nitrogen gas molecules are effectively decomposed to the corresponding gas atoms, and the thus-generated atomic radicals come to have an enhanced internal energy.

The MBE apparatus of Embodiment 2 has the aforementioned radical generator 5, which can provide high nitrogen radical density as described above. Therefore, the MBE apparatus attains an enhanced Group III nitride semiconductor film formation rate, as compared with a conventional MBE apparatus. In addition, since the MBE apparatus of the invention can emit nitrogen radicals having high internal energy, migration of nitrogen on the surface of the crystal can be promoted. In other words, the nitrogen atoms satisfactorily move in the surface layer of the crystal and reach growth sites at higher possibility, whereby the crystallinity of the grown crystal as well as the sharpness of the interlayer interface can be enhanced. Furthermore, the temperature of the substrate 3 can be lowered, whereby the crystallinity can be further enhanced. Also, since the radical generator 5 enables continuous formation of nitrogen radicals for a long period of time, consistent Group III nitride semiconductor film formation is ensured for a long period of time.

Figure 5:
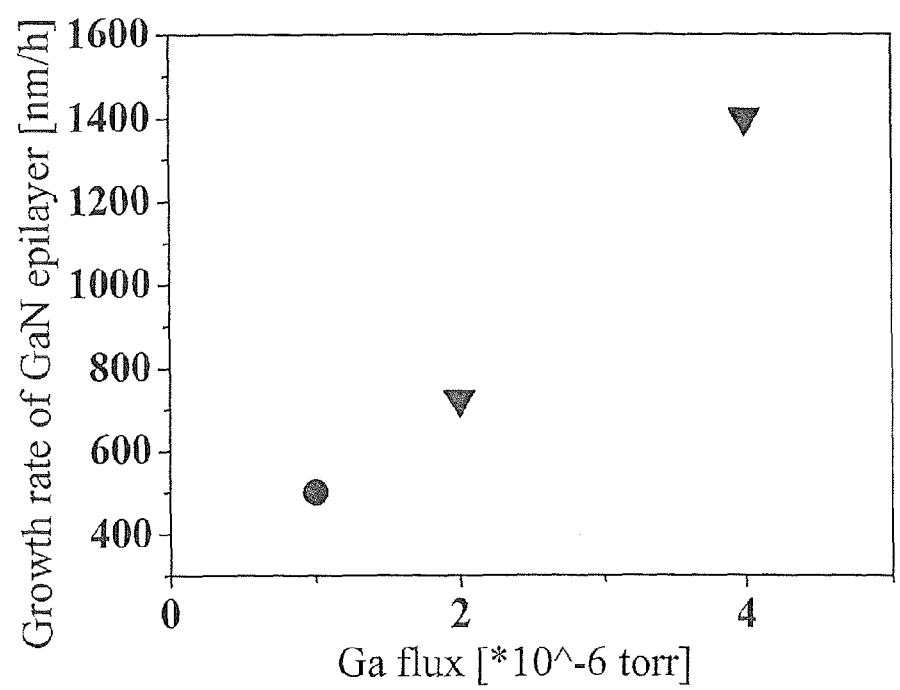
FIG. 5 A graph showing the relationship between the Ga flux in the MBE apparatus of Embodiment 2 and the GaN film formation rate.

FIG. 5 is a graph showing variation in GaN film formation rate with respect to variation in Ga flux, under the following conditions: substrate 3 temperature of 840° C., pressure of $1 \times 10^{-4}$ Torr, and nitrogen gas flow rate of 15 sccm. The GaN film formation rate at a Ga flux of $2 \times 10^{-6}$ Torr was 700 nm/h and that at a Ga flux of $4 \times 10^{-6}$ Torr was 1,400 nm/h, whereas a conventional MBE apparatus attains a GaN film formation rate as low as about 500 nm/h. Since the radical generator 5 of the MBE apparatus of Embodiment 2 provides nitrogen radicals at high density, a film formation rate about thrice as that attained by a conventional MBE apparatus can be realized.

INDUSTRIAL APPLICABILITY

The radical generator of the present invention can be employed as a nitrogen radical generator of a molecular beam epitaxy (MBE) apparatus or a similar apparatus, to thereby form a nitride such as a Group III nitride semiconductor. The radical generator of the present invention also finds a variety of applications such as cleaning of a substrate and substrate surface treatment based on radical radiation.

The MBE apparatus of the present invention is useful as an apparatus for forming a Group III nitride semiconductor film.

DESCRIPTION OF THE REFERENCE NUMERALS

1: vacuum chamber
2: substrate stage
3: substrate
4A, 4B, 4C: molecular beam cell
10: supply tube
11: plasma-generating tube
12: coil
13: CCP electrode
14: permanent magnet
15: parasitic-plasma-preventing tube
16: water-supplying tube
17: water-discharging tube
18: casing
19: orifice plate
20: pore
21: end plate
22: opening

The invention claimed is:

1. A radical generator comprising:
a supply tube comprising a conductive material for supplying a gas;
a plasma-generating tube which is cylindrical and comprises a dielectric material, the plasma-generating tube being connected to the supply tube at a downstream end thereof;
a coil winding about an outer circumference of the plasma-generating tube, for generating an inductively coupled plasma in the plasma-generating tube;
an electrode comprising a double-pipe cylinder having an inner space in which cooling material can be refluxed and covering an outer circumference wall of the plasma-generating tube and which is disposed between the coil and the supply tube, for generating a capacitively coupled plasma in the plasma-generating tube and adding the capacitively coupled plasma to the inductively coupled plasma; and
a parasitic-plasma-preventing tube comprising a dielectric material which extends from a bottom of the plasma-generating tube to an opening of the supply tube in a space between the bottom and the opening, and a tip part thereof is inserted into the supply tube to cover an inner wall of the supply tube for preventing a generation of a parasitic plasma between the electrode and the inner wall of the supply tube.

2. The radical generator according claim 1, further comprising a plurality of permanent magnets which are disposed along the outer side circumference of a zone of the plasma-generating tube where the capacitively coupled plasma is generated and which localize the capacitively coupled plasma to a center of the plasma-generating tube, wherein the respective permanent magnets have been magnetized in the direction orthogonal to a cylinder center axis of the plasma-generating tube, and the plane proximal to the plasma-generating tube has been magnetized as an N pole or an S pole, and the two permanent magnets adjacent each other have inner planes of different magnetic poles such that an N pole and an S pole are alternatingly repeated along a circumferential direction of the plasma-generating tube.

3. A The radical generator according claim 2, wherein the electrode comprises an inner space in which water can be refluxed, and the permanent magnets are disposed so as to be exposed to the inner space of the electrode.

4. The radical generator according claim 2, wherein the electrode is cylindrical.

5. The radical generator according to claim 1, wherein the gas supplied through the supply tube is nitrogen, and nitrogen radicals are generated.

6. The radical generator according claim 1, further comprising:
a holder which holds the parasitic-plasma-preventing tube, a first end of the holder being connected to the plasma-generating tube and a second end of the holder opposite the first end, being connected to the supply tube.

7. A radical generator comprising:
a supply tube for supplying a gas;
a plasma-generating tube comprising a dielectric material, the plasma-generating tube being connected to a supply tube at a downstream end thereof;
a coil winding about an outer circumference of the plasma-generating tube, for generating an inductively coupled plasma in the plasma-generating tube;
an electrode which covers an outer wall of the plasma-generating tube and which is disposed between the coil and the supply tube, for generating a capacitively coupled plasma in the plasma-generating tube and adding the capacitively coupled plasma to the inductively coupled plasma; and
a plurality of permanent magnets which are disposed along an outer circumference of a zone of the plasma-generating tube where the capacitively coupled plasma is generated and which localize the capacitively coupled plasma to a center of the plasma-generating tube,
wherein the respective permanent magnets have been magnetized in the direction orthogonal to a cylinder center axis of the plasma-generating tube, and the plane proximal to the plasma-generating tube has been magnetized as an N pole or an S pole, and the two permanent magnets adjacent each other have inner planes of different magnetic poles such that an N pole and an S pole are alternatingly repeated along a circumferential direction of the plasma-generating tube.

8. A The radical generator according claim 7, wherein the electrode comprises an inner space in which water can be refluxed, and the permanent magnets are disposed so as to be exposed to the inner space of the electrode.

9. The radical generator according claim 8, wherein the electrode is cylindrical.

10. The radical generator according claim 7, wherein the electrode is cylindrical.

* * * * *